(12) United States Patent
Melville et al.

(10) Patent No.: US 7,969,554 B2
(45) Date of Patent: Jun. 28, 2011

(54) METHOD, COMPUTER PROGRAM, APPARATUS AND SYSTEM PROVIDING PRINTING FOR AN ILLUMINATION MASK FOR THREE-DIMENSIONAL IMAGES

(75) Inventors: David O. S. Melville, New York, NY (US); Alan E. Rosenbluth, Yorktown Heights, NY (US); Kehan Tian, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1002 days.

(21) Appl. No.: 11/778,750

(22) Filed: Jul. 17, 2007

(65) Prior Publication Data
US 2009/0021718 A1   Jan. 22, 2009

(51) Int. Cl.
*G03B 27/54* (2006.01)

(52) U.S. Cl. .......................... 355/67; 355/70

(58) Field of Classification Search .............. 355/67, 355/70; 438/326
See application file for complete search history.

(56) References Cited

U.S. PATENT DOCUMENTS

| | | | | |
|---|---|---|---|---|
| 5,091,744 A | * | 2/1992 | Omata | 355/53 |
| 5,680,588 A | | 10/1997 | Gortych et al. | 395/500 |
| 6,563,566 B2 | | 5/2003 | Rosenbluth et al. | 355/67 |
| 7,050,155 B2 | * | 5/2006 | Case et al. | 355/77 |
| 7,057,709 B2 | | 6/2006 | Rosenbluth | 355/69 |
| 2003/0206281 A1 | * | 11/2003 | Jain | 355/53 |
| 2005/0122501 A1 | * | 6/2005 | Rosenbluth | 355/69 |
| 2005/0202350 A1 | | 9/2005 | Colburn et al. | 430/320 |

OTHER PUBLICATIONS

A.E. Rosenbluth and N. Seong, "Global Optimization of the Illumination Distribution to Maximize Integrated Process Window", SPIE v.6154 (2006), 12 pages.
A.K. Wong et al., "Level-specific lithography optimization for 1-GB DRAM," IEEE Transactions on Semiconductor Manufacturing 13, No. 1 (Feb. 2000), pp. 76-87.
M. Burkhardt et al., "Illuminator design for the printing of regular contact patterns," Microelectronic Engineering, v.41-42 (1998), pp. 91-95.
A.E. Rosenbluth, et al., "Optimum Mask and Source Patterns to Print a Given Shape," JM3 1, No. 1 (2002), pp. 13-30.
T.-S. Gau et al., "The Customized Illumination Aperture Filter for Low k1 Photolithography Process", in SPIE v.4000—Optical Microlithography XIII, ed. C.P. Progler (Santa Clara, CA: SPIE, 2000), pp. 271-282.

* cited by examiner

*Primary Examiner* — Hung Henry Nguyen
*Assistant Examiner* — Steven H Whitesell-Gordon
(74) *Attorney, Agent, or Firm* — Harrington & Smith

(57) ABSTRACT

A method able to provide illumination source parameters for illumination of a lithographic mask in order to project a three-dimensional image into a resist system. Source intensities of incident beams are determined using a near linear program and responsive to an allowed range of variation. Computer program, apparatus and system are detailed and variations are described.

20 Claims, 5 Drawing Sheets

$$\int_{z_0}^{F_{Max}} df \left\{ \underset{D}{\text{Min}} \left[ \underset{r}{\text{Min}} \left( \underset{z=z_0}{\overset{z=z_0+f}{\text{Min}}} \left[ \frac{t^{(D)}}{t^{(0)} \vec{s} \cdot \vec{I}_{i(r,D)}(CD_+,z)} \right] \right) \right] - \underset{D}{\text{Max}} \left[ \underset{r}{\text{Max}} \left( \underset{z=z_0}{\overset{z=z_0+f}{\text{Max}}} \left[ \frac{t^{(D)}}{t^{(0)} \vec{s} \cdot \vec{I}_{i(r,D)}(CD_-,z)} \right] \right) \right] \right\}$$

$$\overline{\left( \frac{1}{\vec{s} \cdot \vec{I}_{i(1,0)}(0,z_0)} \right)} \quad +$$

$$\int_{F_{Min}}^{z_0} df \left\{ \underset{D}{\text{Min}} \left[ \underset{r}{\text{Min}} \left( \underset{z=z_0-f}{\overset{z=z_0}{\text{Min}}} \left[ \frac{t^{(D)}}{t^{(0)} \vec{s} \cdot \vec{I}_{i(r,D)}(CD_+,z)} \right] \right) \right] - \underset{D}{\text{Max}} \left[ \underset{r}{\text{Max}} \left( \underset{z=z_0-f}{\overset{z=z_0}{\text{Max}}} \left[ \frac{t^{(D)}}{t^{(0)} \vec{s} \cdot \vec{I}_{i(r,D)}(CD_-,z)} \right] \right) \right] \right\}$$

$$\overline{\left( \frac{1}{\vec{s} \cdot \vec{I}_{i(1,0)}(0,z_0)} \right)}$$

Maximize
w.r.t. $\vec{s}, z_0$

Where $F_{Min} < 0$, and $F_{Max} > 0$, with $F_{Max}$ being the solution to the equation f, such that $$F_{Max} = \underset{D}{\text{Min}} \left[ \underset{r}{\text{Min}} \left( \underset{z=F_{Min}}{\overset{z=F_{Max}}{\text{Max}}} \left[ \frac{t^{(D)}}{t^{(0)} \vec{s} \cdot \vec{I}_{i(r,D)}(CD_-,z)} \right] \right) \right] = \underset{D}{\text{Max}} \left[ \underset{r}{\text{Max}} \left( \underset{z=z_0}{\overset{z=F_{Max}}{\text{Max}}} \left[ \frac{t^{(D)}}{t^{(0)} \vec{s} \cdot \vec{I}_{i(r,D)}(CD_-,z)} \right] \right) \right],$$

and similarly for $F_{Min}$.

This objective function is maximized under constraints:

$$\sum_{j=1}^{J_{Max}} s_j \geq S_{Min}$$

$$s_j \leq S_{Max,j} \qquad (\forall j \mid 1 \leq j \leq J_{Max})$$

$t^{(1)} \vec{s} \cdot \vec{I}_{i(r,n)}(0,n) = t^{(n)}$ non-preset constant $\bigcirc \quad (\forall r,n \mid 1 \leq r \leq r_{Max}[n], n \in \{z_1, z_2 \ldots z_N\})$ $t^{(1)} \vec{s} \cdot \vec{I}_{i(u,n)}(0,n) \geq t^{(n)} I^{(n)}_{Bright} \bigcirc \quad (\forall u,n \mid 1 \leq u \leq u_{Max}[n], n \in \{z_1, z_2 \ldots z_N\})$ $t^{(1)} \vec{s} \cdot \vec{I}_{i(v,n)}(0,n) \leq t^{(n)} I^{(n)}_{Dark} \bigcirc \quad (\forall v,n \mid 1 \leq v \leq v_{Max}[n], n \in \{z_1, z_2 \ldots z_N\})$

FIG. 4

$$F_{Max} = \int_{z_0}^{F_{Max}} df \left\{ \left[ \underset{D}{\text{Min}} \left[ \underset{r}{\text{Min}} \left( \underset{z=z_0}{\overset{z=z_0+f}{\text{Min}}} \left[ \frac{t^{(D)}}{t^{(0)}} \frac{1}{\vec{s} \cdot \vec{I}_{i(r,D)}(CD_+, z)} \right] \right) \right] - \underset{D}{\text{Max}} \left[ \underset{r}{\text{Max}} \left( \underset{z=z_0}{\overset{z=z_0+f}{\text{Max}}} \left[ \frac{t^{(D)}}{t^{(0)}} \frac{1}{\vec{s} \cdot \vec{I}_{i(r,D)}(CD_-, z)} \right] \right) \right] \right\} \Bigg/ \left( 1 \Big/ \vec{s} \cdot \vec{I}_{i(1,0)}(0, z_0) \right)$$

$$\int_{z_0}^{F_{Max}} df \left\{ \left[ \underset{D}{\text{Max}} \left[ \underset{r}{\text{Max}} \left( \underset{z=z_0}{\overset{z=z_0+f}{\text{Max}}} \left[ \frac{t^{(0)}}{t^{(D)}} \vec{s} \cdot \vec{I}_{i(r,D)}(CD_-, z) \right] \right) \right] - \underset{D}{\text{Min}} \left[ \underset{r}{\text{Min}} \left( \underset{z=z_0}{\overset{z=z_0+f}{\text{Min}}} \left[ \frac{t^{(0)}}{t^{(D)}} \vec{s} \cdot \vec{I}_{i(r,D)}(CD_+, z) \right] \right) \right] \right\} \Bigg/ \vec{s} \cdot \vec{I}_{i(1,0)}(0, z_0)$$

$$\text{Maximize} \atop \text{w.r.t. } z_0, K_{Min}, K_{Max}} \left( \text{Maximize} \atop \text{w.r.t. } \vec{d}} \{\psi(z_0, K_{Min}, K_{Max}; \vec{d})\} \right);$$

where objective $\psi$ is defined by: $\psi(z_0, K_{Min}, K_{Max}; \vec{d}) \equiv \sum_{k=K_{Min}}^{K_{Max}} (w'_k - w_k);$ subject to:

a) $0 \leq \vec{\delta}_j S_{Min} \leq S_{Max,j} \vec{d} \cdot \vec{p}$    $(\forall j \mid 1 \leq j \leq J_{Max})$ b) $t^{(0)} \vec{d} \cdot \vec{I}_{[\vec{r},n]}(0, z_0) = t^{(n)}$    $(\forall n, r \mid 1 \leq r \leq r_{Max,OPC}[n], 1 \leq n \leq n_{Max})$ c) $t^{(0)} \vec{d} \cdot \vec{I}_{[u,n]}(0, z_0) \geq t^{(n)} R_{Bright}^{(n)}$    $(\forall n, u \mid 1 \leq u \leq u_{Max}[n], 1 \leq n \leq n_{Max})$ d) $t^{(0)} \vec{d} \cdot \vec{I}_{[v,n]}(0, z_0) \leq t^{(n)} R_{Dark}^{(n)}$    $(\forall n, v \mid 1 \leq v \leq v_{Max}[n], 1 \leq n \leq n_{Max})$ e) $t^{(n)} w'_k \geq t^{(0)} \vec{d} \cdot \vec{I}_{[r,n]}(CD_+, z_0 + k\Delta z)$    $(\forall r, n, k \mid 1 \leq r \leq r_{Max}[n], K_{Min} \leq k \leq K_{Max}, 1 \leq n \leq n_{Max})$ f) $t^{(n)} w'_0 \geq t^{(0)} \vec{d} \cdot \vec{I}_{[r,n]}(CD_+, z_0 + k\Delta z)$    $(\forall r, n, k \mid 1 \leq r \leq r_{Max}[n], K_{Min} \leq k \leq K_{Max}, 1 \leq n \leq n_{Max})$ g) $t^{(n)} w_k \leq t^{(0)} \vec{d} \cdot \vec{I}_{[r,n]}(CD_-, z_0 + k\Delta z)$    $(\forall r, n, k \mid 1 \leq r \leq r_{Max}[n], K_{Min} \leq k \leq K_{Max}, 1 \leq n \leq n_{Max})$ h) $t^{(n)} w_0 \leq t^{(0)} \vec{d} \cdot \vec{I}_{[r,n]}(CD_-, z_0 + k\Delta z)$    $(\forall r, n, k \mid 1 \leq r \leq r_{Max}[n], K_{Min} \leq k \leq K_{Max}, 1 \leq n \leq n_{Max})$ i) $w_k \geq w_{k-1}$    $(\forall k \mid 1 \leq k \leq K_{Max})$ i) $w_k \leq w_{k-1}$    $(\forall k \mid K_{Min}+1 \leq k \leq -1)$ j) $w'_k \leq w'_{k-1}$    $(\forall k \mid 1 \leq k \leq K_{Max})$ j) $w'_k \geq w'_{k-1}$    $(\forall k \mid K_{Min}+1 \leq k \leq -1)$ k) $w_k \leq w'_k$    $(\forall k \mid K_{Min} \leq k \leq K_{Max})$

FIG. 6

METHOD, COMPUTER PROGRAM, APPARATUS AND SYSTEM PROVIDING PRINTING FOR AN ILLUMINATION MASK FOR THREE-DIMENSIONAL IMAGES

TECHNICAL FIELD

The teachings in accordance with the exemplary embodiments of this invention relate generally to manufacturing processes that project high resolution images by illuminating a mask and, more specifically, relate to methods for illumination of an optical mask, for example a photolithographic mask for printing circuit patterns on a semiconductor wafer or chip.

BACKGROUND

Components of a conventional projection lithographic system 80 are shown in FIG. 1. An illumination controller 20 drives an illumination source 30 to illuminate a mask 40 or reticle. The mask includes features that act to diffract the illuminating radiation through a pupil 50 which may control directional extent of the illumination, and through a lens 60 onto an image plane such as a semiconductor wafer 70. The wafer 70 typically includes a resist (photoactive material). When the resist is exposed to the projected image, the developed features in the resist closely conform to the desired patterns that form a target image, which is thus transferred to the wafer 70. The pattern of features on the mask 40 acts as a diffracting structure analogous to a diffraction grating. Increased precision in the formed circuitry depends on the intensities of the illumination that strikes different positions of the wafer 70.

There is increasing interest in methods to optimize the illumination distributions, or sources, used in photolithography to provide for small structures. Exemplary U.S. patents include U.S. Pat. No. 5,680,588, "Method and System for Optimizing Illumination in an Optical Photolithography Projection Imaging System," issued to Gortych et al., Oct. 21, 1997; U.S. Pat. No. 6,563,566, "System and Method for Printing Semiconductor Patterns Using an Optimized Illumination and Reticle" issued to Rosenbluth et al., May 13, 2003; and U.S. Pat. No. 7,057,709, "Printing a mask with maximum possible process window through adjustment of the source distribution" issued to Rosenbluth, Jun. 6, 2006.

Other relevant publications include: "Illuminator design for the printing of regular contact patterns," M. Burkhardt et al., Microelectronic Engineering, v. 41-42 (1998): p. 91.; "The Customized Illumination Aperture Filter for Low k1 Photolithography Process," T.-S. Gau et al., SPIE v. 4000—Optical Microlithography XIII, ed. C. P. Progler (Santa Clara, Calif.: SPIE, 2000), p. 271.; "Optimum Mask and Source Patterns to Print a Given Shape," A. E. Rosenbluth, et al., JM31, no. 1 (2002): p. 13; and "Global optimization of the illuminator distribution to maximize integrated process window", A. E. Rosenbluth and N. Seong, SPIE v. 6154 (2006).

Future generations of projection lithography systems will rely heavily on intensively customized sources to increase the quality of the printing system. Intensively customized sources can be realized physically by using, for example, Diffractive Optical Elements (DOEs). Exploiting such sources by using methods for determining a source distribution provides specialized benefit to photolithographic applications. These methods are referred to as source optimization methods. The intensity distribution provided by a DOE can be optimized with many more degrees of freedom than conventional illumination patterns.

Complex sources involving multiple disconnected lobes are known to improve lithographic performance. Optimizing such shapes often involves making assumptions about the basic topology of the desired source pattern, e.g., the number of separate lobes. Indeed, any method based on local optimization involves refinement from an assumed initial starting design. The above-referenced publication entitled "Optimum Mask and Source Patterns to Print a Given Shape" introduced the idea of globally optimizing the source, i.e., finding the optimum shape without assuming a starting design, and doing so in a way that maximizes a bona fide lithographic metric, rather than by employing mere heuristic assessments. The objective function (merit function), considered in that publication, is directed to obtaining the largest possible exposure latitude in focus, e.g., attaining the sharpest possible focused image.

U.S. Pat. No. 7,057,709 and the publication entitled "Global optimization of the illuminator distribution to maximize integrated process window" describe methods for extending the approach in "Optimum Mask and Source Patterns to Print a Given Shape" to optimize for a maximum possible process window through focus. The so-called ED-window (exposure defocus) analysis is a convenient way to assess lithographic quality that takes both exposure latitude and Depth of Focus (DOF) into account. The integrated area of the ED-window is in turn a very useful single-parameter metric for assessing overall image quality (see "Level-specific lithography optimization for 1-Gb DRAM," A. K. Wong et al., IEEE Transactions on Semiconductor Manufacturing 13, no. 1 (February 2000): p. 76.).

Optimization for providing a maximum process window has been achieved through transformation of percentage dose latitude to arrive at a reformulation as a near linear programming problem (see U.S. Pat. No. 7,057,709 and the publication entitled "Global optimization of the illuminator distribution to maximize integrated process window"). This reformulated problem uses variables representing a scaled version of the unknown source intensities together with additional auxiliary variables, which are defined to monitor the problem's process window. The objective function is then defined to maximize the process window (see "Global optimization of the illuminator distribution to maximize integrated process window"). However, the linear form of the transformed variables does not precisely represent these quantities except in the final optimized solution. Therefore, there is no straightforward application of this method to different lithographic problems.

The above-mentioned optimization is limited in that, as far as each individual mask pattern in the set being optimized is concerned, it is formulated only to maintain a single stabilized 2D image design through focus or through resist depth. This is a classic problem in lithographic image formation, in which the goal is to produce a certain image shape as sharply as possible and to maintain that shape through a large depth of focus. Standard photoresist layers are almost binary in their interaction with the image, which means that the attained image shape is converted to a set of near-vertical-sided openings in the resist film after the resist is developed. To a good approximation, cross sections of the post-develop resist thickness exhibit a binary or tophat character in the classical lithographic scenario, and, in many cases, a perfect tophat shape is acceptable.

However, when adopting a broader definition of lithographic processing, more complex situations occur in which it is advantageous to print openings in the film whose cross-sections through depth take on a prescribed non-binary character. An example of this is a dual damascene structure used commonly for metal interconnects in ultra-large scale integrated circuits. FIG. 2 shows the 'T'-like structure 100 that is preferred. When printing such openings using a single exposure, it is preferred to use a controlled dose profile through the depth of the resist. More precisely, there needs to be a way to expose the resist with a three-dimensional dose profile that approaches a prescribed dose profile under as large a range of fluctuations in exposure time and lens focus as possible (e.g., maintain tolerance over as large a lithographic process window as possible).

One problem is that under non-tophat applications the state-of-the-art source optimization approach, such as shown in U.S. Pat. No. 7,057,709 and the publication entitled "Global optimization of the illuminator distribution to maximize integrated process window", no longer applies. Using such a method for a pure tophat target profile one could define auxiliary variables using constraints that involved only the intensity, e.g., constraints that are independent of the resist sensitivity. Moreover, the constraints on the image itself only refer to intensities normalized to an anchor dose. It is only under these conditions that a near linear-programming problem may be shown to be sufficient for calculating the globally optimum source. With the previously considered tophat target profiles, this source optimization approach was constructed such that the act of optimizing an objective function which involved the auxiliary variables would inherently push these variables to values that defined a process window. Moreover, as a consequence of being optimized, the function would converge to the optimized process window. However, lithographic processes like those described in "Method for fabricating dual damascene structures", M. E. Colburn et al., US Pat. Publ. No. 2005/0202350, require target profiles that are not tophat.

The core notion of a lithographic process window, whose optimization is desired, was developed in the context of a low-NA (numerical aperture) procedure, where the resist image could be imagined to propagate in air. Under such circumstances there is no distinction between a change in lens focus (which may equivalently be caused by a fluctuation in wafer height) and a change in z-location within the "resist layer", which is simply the focal region of the aerial image in this elementary case, at which printing is evaluated. However, in current lithographic simulations it is often necessary to take into account the detailed optical properties of the resist film stack, which in effect introduces severe aberrations. Under such conditions, a change in depth within the resist layer is no longer equivalent to a change in focus. Moreover, when the wafer is at nominal focus, the character of the image above the resist stack and the character of the image below the stack can both affect the quality of the exposing image when focus fluctuations shift the wafer stack away from nominal, particularly if quality is assessed by averaging across the layer thickness.

One way to achieve a desired three-dimensional topology is to use multiple layers with varying sensitivity and to expose them using multiple exposures. In many cases the desired profile is stepped in depth; otherwise a large number of layers (physically, or in simulation) can produce a stepped approximation to the desired profile.

Such a process is the subject of U.S. Pat. Publ. No. 2005/0202350 and is illustrated in FIG. 2. In that embodiment two resist layers 110 and 120 are placed on top of the non-photosensitive process film to be patterned 130. The two resist layers 110 and 120 are given different sensitivities; the top layer 110 would typically be given a higher sensitivity than the bottom layer 120, which means that its dose-to-clear value would be lower. The resist stack is then exposed with a mask 40 that will print the features desired in the top layer 110, but with only as much dose as is needed to develop the feature profile shown in the top layer 110. This first exposing dose is not sufficient to produce an above-threshold exposure in the bottom layer 120. A second exposure is then done with a mask 40 which prints the features desired in the second layer 120 of resist, but this time with a higher dose, i.e., high enough to have the bottom layer 120 develop though. When the structure is then developed the result is the 'T' dual damascene profile 100.

Producing an aerial image that would give the correct profile after a single exposure and development of a single layer of resist is very difficult. To print the structure in one exposure, a mask 40 must be made that will produce lower dose factors in the areas where only the top layer 110 is intended to develop. One possible technique to accomplish this may be to use mask optimizations, such as a grey level mask, to reduce the intensity transmission in those areas. However, there remains a need for finding the best source for printing such a 3D structure, while taking into account the different resist sensitivity levels through depth. In analyzing such a process one would have to consider that the developed contour will not purely follow the sensitivity profile, since the optical image changes structure as it propagates through the resist stack.

As should be apparent, there is a need for new near linear programming methods for determining source optimization for three-dimensional designs.

SUMMARY

The foregoing and other problems are overcome, and other advantages are realized, in accordance with the presently described embodiments of these teachings.

One exemplary embodiment of the invention is a mask illumination method. In this method an allowed range of at least one photolithographic process parameter is determined. This parameter(s) can include exposure time, dose variation, depth variation, wafer height and focal variation. Next a plurality of source intensities of a plurality of incident mask illumination beams is determined using a near linear program. These determined plurality of source intensities fall within the allowed range without causing the projected shape to unacceptably depart from a desired three-dimensional shape. While some departure from the desired three-dimensional shape may be allowed, it must remain within the allowed range to be acceptable. Further, a photolithographic mask is illuminated using a combination of source illumination parameters for illuminating the lithographic mask with light from a plurality of directions such that the plurality of source intensities of incident beams of light provides a process window defined in terms of the allowed range.

The allowed range may be defined in terms of an exposure time range that is determined with respect to fast and slow boundaries. This uses a first set of constraints which represent maximum exposure times that can be permitted for the fast boundaries and a second set of constraints which represent minimum exposure times that can be permitted for the slow boundaries.

Additionally, the method may use focal variations that have nonuniform step sizes. Also, the source illumination parameters may contain illumination sources defined in terms of overlapping source pixels.

Furthermore, this method may be used to provide illumination of a wafer with multiple exposures which may have different illumination parameters.

A further exemplary embodiment of the invention is a computer program product. The first step is determining an allowed range of at least one photolithographic process parameter. These parameters can include exposure time, dose variation, depth variation, wafer height and focal variation. Next a plurality of source intensities of a plurality of incident mask illumination beams is determined using a near linear program. These determined plurality of source intensities fall within the allowed range without causing the projected shape to unacceptably depart from a desired three-dimensional shape. Further, a combination of source illumination parameters for illuminating the lithographic mask with light from a plurality of directions is provided is that the plurality of source intensities of incident beams of light provides a process window defined in terms of the allowed range.

The allowed range may be defined in terms of an exposure time range that is determined with respect to fast and slow boundaries. This uses a first set of constraints which represent maximum exposure times that can be permitted for the fast boundaries and a second set of constraints which represent minimum exposure times that can be permitted for the slow boundaries.

Additionally, the computer program may use focal variations that have nonuniform step sizes. The source illumination parameters may contain illumination sources defined in terms of overlapping source pixels. The source illumination parameters may also have a defined polarization. Polarization parameters are typically X-polarized, Y-polarized, or unpolarized.

Another exemplary embodiment of the invention is an apparatus. This apparatus includes a driver which is configured to determine an allowed range of at least one photolithographic process parameter. The driver is further configured to determine a plurality of source intensities of a plurality of incident mask illumination beams using a near linear program, where the determined plurality of source intensities fall within said allowed range without causing the projected shape to unacceptably depart from a desired three-dimensional shape. This apparatus also includes a set of illumination sources configurable to illuminate a photolithographic mask using a combination of source illumination parameters for illuminating the lithographic mask with light from a plurality of directions such that the plurality of intensities of incident beams of light provide a process window defined in terms of the allowed range.

The allowed range may be defined in terms of an exposure time range that is determined with respect to fast and slow boundaries. This uses a first set of constraints which represent maximum exposure times that can be permitted for the fast boundaries and a second set of constraints which represent minimum exposure times that can be permitted for the slow boundaries.

Additionally, the driver may be configured to use focal variations that have nonuniform step sizes. Also, the source illumination parameters may contain illumination sources defined in terms of overlapping source pixels.

Furthermore, this apparatus may be used to provide illumination of a wafer with multiple exposures which may have different illumination parameters.

A further exemplary embodiment of the invention is a system for illuminating a mask. The system includes a means for determining an allowed range of at least one photolithographic process parameter. It further includes means for determining a plurality of source intensities of a plurality of incident mask illumination beams using a near linear program, where the determined plurality of source intensities fall within said allowed range without causing the projected shape to unacceptably depart from a desired three-dimensional shape. Further, means for illuminating a photolithographic mask using a combination of source illumination parameters for illuminating the lithographic mask with light from a plurality of directions such that the plurality of intensities of incident beams of light provide a process window defined in terms of said allowed range are included in the system.

Additionally, this system may be used to provide illumination of a wafer with multiple exposures which may have different illumination parameters. Also, the source illumination parameters may contain illumination sources defined in terms of overlapping source pixels.

BRIEF DESCRIPTION OF THE DRAWINGS

The foregoing and other aspects of embodiments of this invention are made more evident in the following Detailed Description, when read in conjunction with the attached Drawing Figures, wherein:

FIG. 4 shows an equation for determining the list of source intensities;

FIG. 5 shows an equation for approximation the percentage exposure latitude;

FIG. 6 shows an equation which is a reformulation of the source optimization problem;

DETAILED DESCRIPTION

Figure 1:
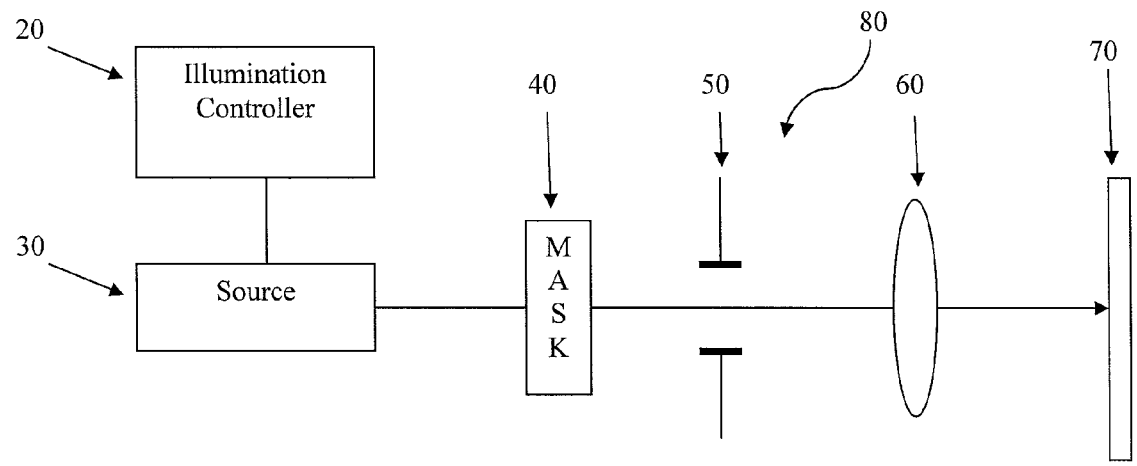
FIG. 1 illustrates a simplified block diagram of an apparatus known in the art for performing photolithography.
Figure 2:
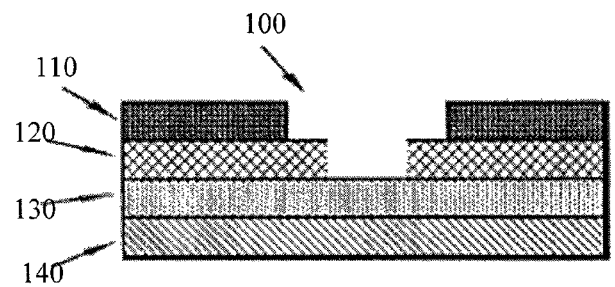
FIG. 2 shows a dual damascene structure printed in a two-resist stack, where a top resist layer is of different sensitivity than a lower layer.
Figure 3:
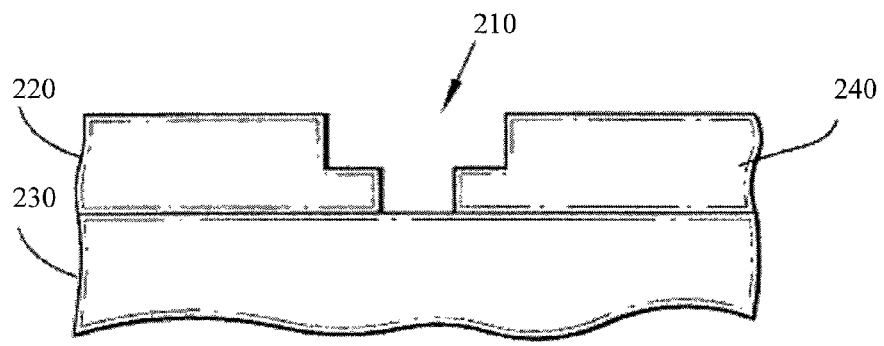
FIG. 3 shows a three-dimensional 'T' profile in a resist layer.

The exemplary embodiments of this invention provide a process for finding the best illumination source distribution for printing a three-dimensional structure, while taking into account the different sensitivity levels through depths of a resist, and consider that the developed contour will not purely follow the sensitivity profile, since the optical image changes structure as it propagates through the resist stack.

As explained herein, "intensity" and "image intensity" refer to an intensity that has been generalized to account for resist diffusion (or, even more generally, to account for convolution with an influence kernel). This generalized intensity incorporates some of the minor deviations that may be present in the resist's response away from a purely binary thresholded behavior into the calculated "optical" intensity profile. By generalizing the intensity in this way more accurate predictions are obtained when applying a threshold to the generalized image. There will be no specific reference to the employment of an intensity function that is not purely optical. The standard methods can be used to obtain kernels that allow calculation of the generalized image associated with the particular resist influence kernel that is relevant to the resist material at each particular depth (in the case where the resist properties vary with depth). However, these kernels may be all normalized independently, such as being specified in units where an isolated film of the given resist would have a dose-to-clear of 1.

The exemplary embodiments of this invention pertain to the formulation of a near linear programming problem for determining a source distribution to be used in projection lithography to produce dose control in three-dimensions at the imaging plane of the system. It allows for multiple stacked resist layers with different dose-to-clear levels giving a path to globally optimize source distributions for dual damascene type structures. The use of the exemplary embodiments of this invention is not limited to dual damascene structures, and may be used for any type of three-dimensional structure.

In this context "near linear" refers to the similarity of the problem's structure to that of a pure linear programming problem; it does not refer to the degree of linearity involved. A linear programming problem is one in which the objective and constraint functions are linear. Standard solvers can quickly find the solution to linear programming problems even when they involve a relatively large number of variables and constraints.

The first step of source pixelation follows the previous work disclosed by "Global optimization of the illuminator distribution to maximize integrated process window". Once the illumination pixelation is defined, the optimum source can be expressed formally as a vector set of unknowns, $\vec{s}$ ($\vec{s}$ is an initially unknown list of optimum intensity values for each of the source elements, which are also referred to as source pixels). Additionally, $\vec{s}$ can represent a polarized source element (commonly X-polarized, Y-polarized, or unpolarized) that can overlap other elements of different or similar polarization. In the image plane, the intensity at a given point is then written as a sum of contributions from each unknown element, i.e., $\vec{s} \cdot \vec{I}$ (note that the intensity contributions from different elements add incoherently). The exposure, reciprocal intensity, at a given image-plane sample point, in this case the ith sample point, is designated using the notation:

$$E_i = \frac{1}{\vec{s} \cdot \vec{I}_i(x, z)}. \quad [1]$$

The desired image shape is specified using sample points that map out the nominally bright and dark regions of the image. To formulate the problem for a three-dimensional design (i.e., varying point locations for different focal planes) and varying layer sensitivity, improvements are required to the equations presented in US Pat. Publ. No. 2005/0202350.

A set of points is assigned to a given focal depth in order to handle the changing design through focus. To distinguish bright and dark sample points in a layer, a notational convention is used where the generic subscript index i is replaced by i(u, D) (for bright) or i(v, D) (dark) at a given depth D. The number of points at different focal planes may vary leading to changing integer limits on u and v. Additional sample points are chosen near key target edges in a layer, for example at or near the desired edge positions of critical dimensions (CDs) in the image. Subscript indices for such edge sample points are denoted i(r, D). The CD slice for the rth edge point is considered to cut the aerial image along a coordinate x, independent of whether the orientation of the feature edge in question is actually horizontal, vertical, or non-Manhattan. The CD slice can thus be regarded as a plot of intensity vs. x in a direction through the sample point that is locally perpendicular to the feature edge for a given defocus, which could be curved, e.g., the perimeter of a contact hole.

Three sample points are associated with the rth edge point. The first sample point is located precisely at the desired target perimeter for the feature, and the intensity at this sample point is denoted $\vec{s} \cdot \vec{I}_{i(r,D)}(0,Z)$ for defocus z and depth D. Note that x is thus a local coordinate associated with the edge which is defined in such a way that x=0 always represents the target edge.

Once a CD tolerance is specified for the feature (or a combined CD+ Position Shift tolerance), a sample point can be placed at the extreme position of allowable overexposure along the associated CD slice; this sample point position is denoted as x=CD+. The equation $\vec{s} \cdot \vec{I}_{i(r,D)}(CD_+,z)$ then denotes the intensity at this position of maximum allowable overexposure for defocus z and depth D. Likewise, x=CD− designates a sample point at the position of worst allowable underexposure, and $\vec{s} \cdot \vec{I}_{i(r,D)}(CD_-, z)$ is the intensity at this point.

These tolerances are also referred to as fast and slow boundaries. A fast boundary refers to an edge tolerance point that prints first during an exposure (CD−) and is where the edge would print if under-exposed. The slow boundary is the opposite. It is the final edge tolerance point to print (CD+) and relates to the edge's printed location if over-exposed.

To allow control of the sensitivity for each layer, a new variable $t^{(D)}$ is used, which denotes the time-to-clear for the resist at depth D. This corresponds to how much time, proportional to dose, a given resist needs in order to develop, in a film of some nominal thickness.

To illuminate the mask with a source that maximizes integrated process window, the list of source intensities $\vec{s}$ is determined so that it satisfies problem [2], shown in FIG. 4.

Here n is a discretized list of depths D where the constraints should be applied. Note, $I_{Bright}^{(n)}$ and $I_{Dark}^{(n)}$ are the doses required at the bright and dark points, respectively, at resist depth n. The variable $z_0$ is the unknown position of best focus, which may be interpreted as the optimal position of the entire film stack (wafer height) relative to the image projected from the lens.

Similar to the formulation in U.S. Pat. No. 7,057,709 and the publication entitled "Global optimization of the illuminator distribution to maximize integrated process window", the above formulation is distinctly nonlinear, but in contrast to the conventional approach, the merit function in eq. [2] has changed from the integral of relative (essentially percentile or fractional) dose latitude over all achievable depths of focus, to the integral of relative exposure time latitude for a varying design through the depth of a wafer stack with resist layers of varying time-to-clear. Relative exposure time latitude is subsequently integrated over variations in wafer focus.

The unknowns $\vec{s}$ appear in the numerator as well as the denominator in order that the exposure time latitude across wafer height which is maximized is the relative exposure time latitude. (The absolute intensity scale is considered unimportant in this context.) For simplicity, the denominator exposure chosen for the normalization is taken as the exposure which prints the first r=1 edge at nominal.

The upper and lower exposure time limits which define the exposure time latitude (over a given focal range f) involve triple maximizations or triple minimizations. For example, the achieved latitude can be no larger than the latitude that is attained by the weakest feature in the pattern, so in the integrand the maximum latitude is taken as the minimum over r of the upper exposure limits attained at each edge, at any resist depth. Likewise the minimum latitude is the maximum over r of the lower exposure limits. As seen in U.S. Pat. No. 7,057,709 and "Global optimization of the illuminator distribution to maximize integrated process window", for a particular exposure level to be considered valid over a given focal range of $F_{Min}$ to $F_{Max}$, it is not sufficient that the exposure merely print all CDs within tolerance at wafer height $z=F_{Min}$ and $z=F_{Max}$. In addition, the exposure must successfully print the CDs at all intermediate focal planes between $z=F_{Min}$ and $z=F_{Max}$. The variable of integration, f, is preferably interpreted as focal range, not as a simple wafer height. The maximum allowable exposure time in a given focal range f is thus the minimum of the upper latitude limits achieved across all focal planes within the range of $z=F_{Min}$ to $z=F_{Max}$.

Similarly, the lower latitude limit is defined in terms of a triple maximization over r and z.

The limits of integration, $F_{Min}$ and $F_{Max}$, are also defined in a nonlinear way, namely as the wafer height at which the exposure latitude first closes down to 0 in the negative z and positive wafer height directions, respectively. $F_{Max}-F_{Min}$ is thus the maximum attainable DOF, i.e., the "length" of the ED window if exposure-time latitude is regarded as the window "width". No single exposure time may actually provide a DOF as large as $F_{Max}-F_{Min}$. Unlike in the analysis of "Global optimization of the illuminator distribution to maximize integrated process window", eq. [2] now has a form that allows for an asymmetric response through focus, and therefore can take aberrations other than defocus into account.

The objective function is preferably optimized with respect to focus setpoint; or in other words, to be maximized over $z_0$. This maximization finds the location of the in-focus plane to give the exposure-time latitude.

Two approximations are made to eq. [2] before formulating the near linear programming problem. The first is to replace the continuous integration with a sampled sum. A layer is defined as a certain group of depth ranges where a set of design points, contrast ratios for bright and dark regions, and time-to-clear values are defined. There does not have to be a continuous focal range. The time-to-clear, $I_{Bright}$, and $I_{Dark}$ variables are also modified from continuous to discrete variables that are defined inside each layer (i.e., $t^{[n]}$, $I_{Bright}^{(n)}$, and $I_{Dark}^{(n)}$).

The second approximation is performed by approximating the percentage (or fractional) exposure latitude in eq. [2] by fractional intensity. The integral for f greater than $z_0$ gives the result shown in FIG. 5.

The same approximation follows for the integral of f less than $z_0$. By using these approximations and extending the notation of U.S. Pat. No. 7,057,709 and the publication entitled "Global optimization of the illuminator distribution to maximize integrated process window", the optimization can be formulated as a near linear programming problem.

In this formulation the intensity tables which generate the $\vec{I}$ coefficients are assumed to now include the different maximum power levels that are available from each source pixel. This is in contrast to U.S. Pat. No. 7,057,709 and the publication entitled "Global optimization of the illuminator distribution to maximize integrated process window" where the power is kept in the source variables. The list of maximum available powers is designated as $\vec{p}$; most often the jth element of $\vec{p}$ would be equal to the (pre-blurred) area of the jth pixel. For the sake of generality the jth source pixel intensity is allowed to be constrained in a particular problem at a level different from $p_j$. Specifically, a maximum allowed fraction of $p_j$ that the jth pixel can attain is denoted $S_{Max,j}$; most often $S_{Max,j}$ would be 1. This causes the solution to be defined on a relative 0-to-1 scale. The source optimization problem can then be reformulated as eq. [3], shown in FIG. 6.

The source intensities are then obtained from:

$$s_j = d_j \mathrm{Min}_j\left[\frac{S_{Max,j}}{d_j}\right] \quad [4]$$

An additional loop is constructed to maximize the focus depth in the final layer. This loop performs the same maximization while setting the limit on k for the final layer to $K_{Max}$ instead of $k_{Max}[n]$. The loop then optimizes the process window while varying $K_{Max}$.

With complex depth profiles, such as those that are the subject of this embodiment, the asymmetry of the problem through focus may be taken into account. For this reason a thoroughly rigorous solution is found by optimizing with an exhaustive search within a space of non-Linear Problem (or non-LP) variables that are three-dimensional; in addition to $K_{Max}$, these non-LP variables now include a (negative) upper focal limit variable $K_{Min}$, and a center focus setpoint $z_0$. These variables, along with focus iterator k, refer to lens focus, or equivalently to overall wafer position within the focused beam as influenced, for example, by topography in the underlying circuit, or by wafer chucking errors. In contrast, iterator variable n refers to position within the stack, as measured, for example, relative to the top surface. The intensity vector, $\vec{I}$, exhibits a separate dependence on resist depth (indicated by a second subscript argument n) and lens focus (given by $z_0-k\Delta z$ in the 2nd argument of $\vec{I}$), as well as the sample point involved (indicated with a first subscript argument), and in some cases on position along the cutline through the sample point (indicated by the first argument of $\vec{I}$).

Given the relatively low levels of asymmetry that are involved here, it is very reasonable to use local optimization in an outer loop to solve for $K_{Min}$ and $z_0$, with an LP and exhaustive $K_{Max}$ search being used to solve the remaining variables globally at each step inside the loop. This may be done by first choosing $z_0$ by local search, using an embedded inner step in which exposure latitude is globally optimized over the source variables at k=0. The midpoint of the refractively extended resist stack is a reasonable starting point for the $z_0$ search. $K_{Max}$ is next determined by the procedure described above. Finally, $K_{Min}$ is determined by local optimization, using $-K_{Min}$ as a starting point.

The only significance of an increased asymmetry level is that the determination and optimization of the $K_{Min}$, $z_0$, and $K_{Max}$ variables may simply take longer.

After the variables $K_{Max}$, $K_{Min}$, and $z_0$ are determined by the above sequential procedure, these values may be "polished" using a stage of joint local optimization. Also, it is quite reasonable to use local optimization to determine $K_{Max}$, as well as to determine $K_{Min}$ and $z_0$. In any of these local optimization steps, search efficiency can be improved by converting $K_{Max}$, $K_{Min}$, and $z_0$ to continuous variables. In the case of $z_0$ this can be accomplished by higher order interpolation of the raw $\vec{I}$ values. The $K_{Max}$ and $K_{Min}$ variables can be made continuous by defining them using a sequence of focal weights, $\vec{h}$, that includes a slightly broadened focus cutoff. The objective function then becomes $\vec{h}\cdot(\vec{w}'-\vec{w})$. The arctangent function has a suitable shape for defining the cutoff, with the rolloff being shifted to the focal position defined by $K_{Min}$, $z_0$, or $K_{Max}$, and being scaled such that the width of the rolloff zone is comparable to the focus gridstep $\Delta z$.

Figure 7:
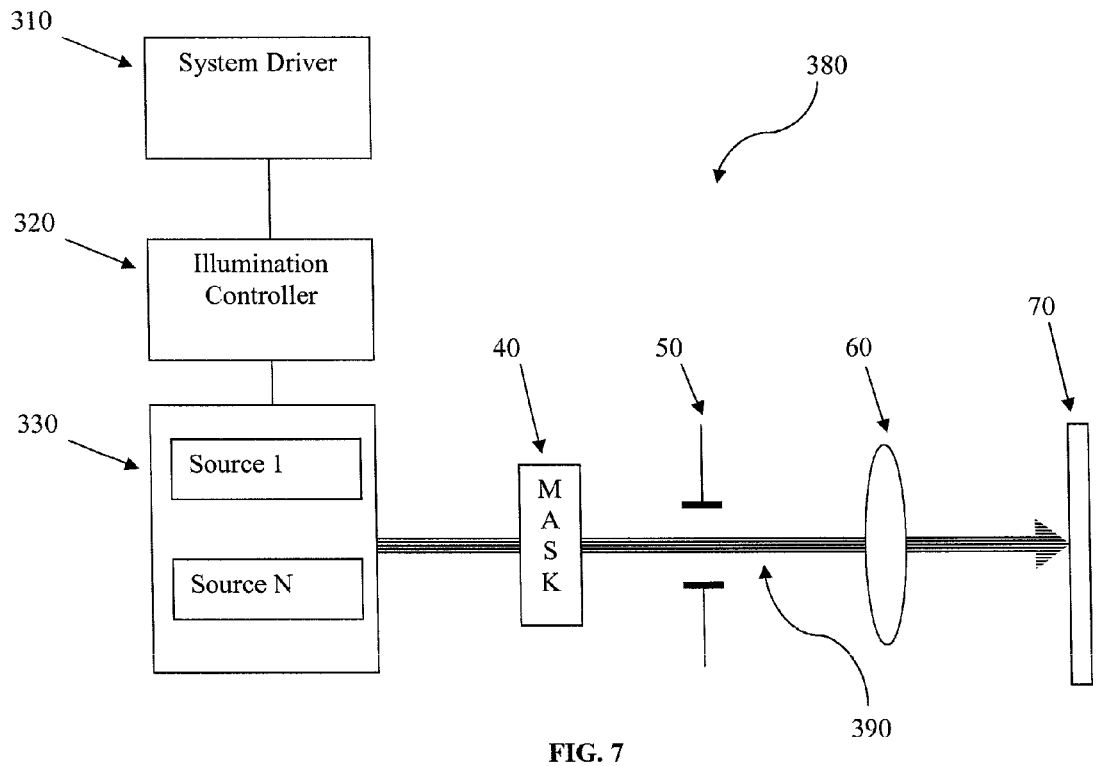
FIG. 7 illustrates a simplified block diagram of a system that is suitable for use in practicing the exemplary embodiments of this invention.

FIG. 7 depicts one embodiment of a system 380 that includes a system driver 310 for operating in accordance with the teachings herein. Preferably, the system driver 310 communicates with, and may control, the illumination controller 320 which drives a number of illumination sources 330. The sources 330 provide a number of incident beams of light 390 which may be from different directions and have different intensities. Preferably, the system driver 310 provides for execution of instructions for obtaining the source solution. The system driver 310 may include any equipment as appropriate for execution of the instructions. Non-limiting examples of system driver 310 components include a computer, software (a computer program), a computer readable medium or memory (such as a magnetic and/or optical disk drive, tape, semiconductor storage, and other types of memory). Other system driver 310 components may be included. The system 380 may make use of other components present in prior art lithography systems 80, such as those shown in FIG. 1.

Figure 8:
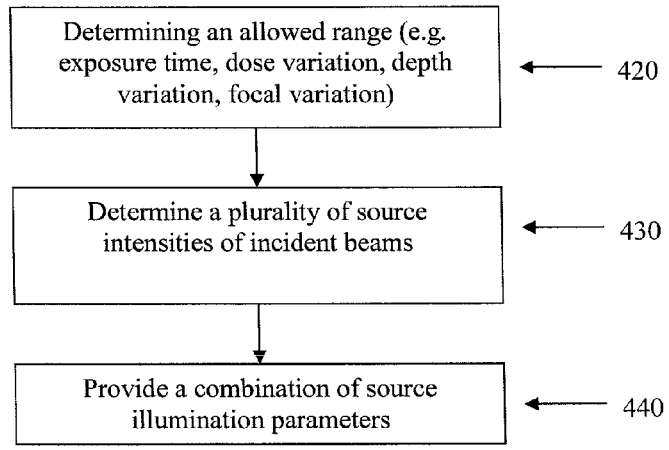
FIG. 8 depicts a flowchart illustrating one non-limiting example of a method for practicing the exemplary embodiments of this invention.

FIG. 8 depicts a flowchart of the above procedure for obtaining the source solution. In step 420, an allowed range of at least one of exposure time, dose variation, depth variation or focal variation is determined for a desired three-dimensional shape which is to be projected. In step 430 a plurality, i.e., one or more, of source intensities of incident beams are determined. In step 440, a combination of source illumination parameters are provided.

Modifications to the above-described apparatus and method are possible, and several (non-limiting) examples are now provided.

For example, double exposures can be accommodated by concatenating the $\vec{s}$ and $\vec{I}$ vectors. The two exposures may have different individual focus setpoints, with a process window defined in terms of z-translations of the entire stack.

To reduce computational load the problem can be modified to allow nonuniform steps through focus. Instead of using constant steps of $\Delta z$, the step sizes may be modified around regions that are found to be of interest. In this manner the best fine grained search is found while locally optimizing for $K_{Min}$, $K_{Max}$, and $z_0$. Suitable weights may be included in the objective function.

Further, Quadrature coefficients can be used in the objective function to make the sum more closely approximate the true integral.

Also, the formulation using the maximum available power variable $\vec{p}$ allows for arbitrary definition of the source, including overlapping pixels.

It should be appreciated that this invention can be applied to all wavelengths including smaller wavelengths (EUV, X-ray), where the need for intensive optimization may not be as significant.

Generally, various exemplary embodiments of the invention can be implemented in different mediums, such as software, hardware, logic, special purpose circuits or any combination thereof. As a non-limiting example, some aspects may be implemented in software which may be run on a computing device, while other aspects may be implemented in hardware.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:

1. A mask illumination method, comprising:
    determining an allowed range of at least one photolithographic process parameter;
    determining a plurality of source intensities of a plurality of incident mask illumination beams using a near linear program, where the determined plurality of source intensities fall within said allowed range without causing the projected shape to unacceptably depart from a desired three-dimensional shape,
    where the desired three-dimensional shape comprises at least two different cross-section layers; and
    illuminating a photolithographic mask using a combination of source illumination parameters for illuminating the lithographic mask with light from a plurality of directions such that the plurality of intensities of incident beams of light provide a process window defined in terms of the allowed range.

2. The method of claim 1, where said photolithographic process parameters comprise at least one of: exposure time, dose variation, depth variation, wafer height and focal variation.

3. The method of claim 2, where said exposure time range is determined with respect to a first set of constraints which represent maximum exposure times for fast boundaries and a second set of constraints which represent minimum exposure times for slow boundaries.

4. The method of claim 2, where said focal variations have nonuniform step sizes.

5. The method of claim 1, further comprising illuminating a wafer with multiple exposures which may have different illumination parameters.

6. The method of claim 1, where said plurality of source intensities of incident beams of light include at least one of overlapping source pixels and defined polarization.

7. A non-transitory computer readable medium tangibly embodying a program of machine-readable instructions executable by a digital processing apparatus to perform operations for mask illumination, the operations comprising:
    determining an allowed range of at least one photolithographic process parameter;
    determining a plurality of source intensities of a plurality of incident mask illumination beams using a near linear program, where the determined plurality of source intensities fall within said allowed range without causing the projected shape to unacceptably depart from a desired three-dimensional shape,
    where the desired three-dimensional shape comprises at least two different cross-section layers; and
    providing a combination of source illumination parameters for illuminating the lithographic mask with light from a plurality of directions such that the plurality of source intensities of incident beams of light provide a process window defined in terms of the allowed range.

8. The computer readable medium of claim 7, where said photolithographic process parameters comprise at least one of: exposure time, dose variation, depth variation, wafer height and focal variation.

9. The computer readable medium of claim 8, where said exposure time range is determined with respect to a first set of constraints which represent maximum exposure times for fast boundaries and a second set of constraints which represent minimum exposure times for slow boundaries.

10. The computer readable medium of claim 8, where the focal variations have nonuniform step sizes.

11. The computer readable medium of claim 7, where said plurality of source intensities of incident beams of light include at least one of overlapping source pixels and defined polarization.

12. An apparatus comprising:
a driver configured to determine an allowed range of at least one photolithographic process parameter and to determine a plurality of source intensities of a plurality of incident mask illumination beams using a near linear program, where the determined plurality of source intensities fall within said allowed range without causing the projected shape to unacceptably depart from a desired three-dimensional shape,
where the desired three-dimensional shape comprises at least two different cross-section layers; and
a set of illumination sources, configurable to illuminate a photolithographic mask using a combination of source illumination parameters for illuminating the lithographic mask with light from a plurality of directions such that the plurality of source intensities of incident beams of light provide a process window defined in terms of the allowed range.

13. The apparatus of claim 12, where said photolithographic process parameters comprise at least one of: exposure time, dose variation, depth variation, wafer height and focal variation.

14. The apparatus of claim 13, where said exposure time range is determined with respect to a first set of constraints which represent maximum exposure times for fast boundaries and a second set of constraints which represent minimum exposure times for slow boundaries.

15. The apparatus of claim 13, where said focal variations have nonuniform step sizes.

16. The apparatus of claim 12, further comprising illuminating a wafer with multiple exposures which may have different illumination parameters.

17. The apparatus of claim 12, where said plurality of source intensities of incident beams of light include at least one of overlapping source pixels and defined polarization.

18. A system for illuminating a mask comprising:
means for determining an allowed range of at least one photolithographic process parameter;
means for determining a plurality of source intensities of a plurality of incident mask illumination beams using a near linear program, where the determined plurality of source intensities fall within said allowed range without causing the projected shape to unacceptably depart from a desired three-dimensional shape,
where the desired three-dimensional shape comprises at least two different cross-section layers; and
means for illuminating a photolithographic mask using a combination of source illumination parameters for illuminating the lithographic mask with light from a plurality of directions such that the plurality of source intensities of incident beams of light provide a process window defined in terms of said allowed range.

19. The system of claim 18, where said illuminated mask if further used to illuminate a wafer with multiple exposures which may have different illumination parameters.

20. The system of claim 18, where said plurality of source intensities of incident beams of light include at least one of overlapping source pixels and defined polarization.

* * * * *